United States Patent [19]
Marabella et al.

[11] Patent Number: 5,748,654
[45] Date of Patent: May 5, 1998

[54] DIODE ARRAY PROVIDING EITHER A PULSED OR A CW MODE OF OPERATION OF A DIODE PUMPED SOLID STATE LASER

[75] Inventors: Leonard J. Marabella, Torrance; Jacqueline G. Berg, Glendale; Gerald W. Holleman, Manhattan Beach; Hagop Injeyan, Glendale; James M. Zamel, Hermosa Beach, all of Calif.

[73] Assignee: TRW Inc., Redondo Beach, Calif.

[21] Appl. No.: 664,659

[22] Filed: Jun. 17, 1996

[51] Int. Cl.⁶ .................................. H01S 3/098
[52] U.S. Cl. .................... 372/19; 372/75; 372/25
[58] Field of Search .................... 372/75, 34, 36, 372/19, 25

[56] References Cited

U.S. PATENT DOCUMENTS

| | | | |
|---|---|---|---|
| 4,454,602 | 6/1984 | Smith | 372/36 |
| 4,674,095 | 6/1987 | Heinen et al. | 372/50 |
| 4,785,459 | 11/1988 | Baer | 372/75 |
| 4,791,634 | 12/1988 | Miyake | 372/34 |
| 4,808,789 | 2/1989 | Muncheryan | 219/121.6 |
| 4,916,712 | 4/1990 | Bender | 372/75 |
| 4,942,586 | 7/1990 | Lai | 372/68 |
| 4,969,155 | 11/1990 | Kahan | 372/70 |
| 5,084,886 | 1/1992 | Martin | 372/75 |
| 5,105,429 | 4/1992 | Mundinger et al. | 372/34 |
| 5,105,430 | 4/1992 | Mundinger et al. | 372/35 |
| 5,139,609 | 8/1992 | Fields et al. | 156/643 |
| 5,140,607 | 8/1992 | Paiva | 372/70 |
| 5,170,406 | 12/1992 | Tidwell | 372/71 |
| 5,271,031 | 12/1993 | Baer | 372/93 |
| 5,291,504 | 3/1994 | Bournes | 372/34 |
| 5,299,222 | 3/1994 | Shannon et al. | 372/75 |
| 5,309,457 | 5/1994 | Minch | 372/34 |
| 5,311,528 | 5/1994 | Fujino | 372/35 |
| 5,317,447 | 5/1994 | Baird et al. | 359/328 |
| 5,325,384 | 6/1994 | Herb et al. | 372/36 |
| 5,337,325 | 8/1994 | Hwang | 372/75 |
| 5,369,661 | 11/1994 | Yamaguchi et al. | 372/69 |
| 5,394,426 | 2/1995 | Joslin | 372/50 |
| 5,394,427 | 2/1995 | McMinn et al. | 372/70 |

Primary Examiner—Leon Scott, Jr.
Attorney, Agent, or Firm—Michael S. Yatsko

[57] ABSTRACT

A technique for operating a diode pumped solid state laser in a continuous-wave (cw) mode using diodes blocks (12) that are individually operated in a pulsed mode. For some high power laser applications, it is desirable to provide for operation in pulsed and cw modes, but pump diodes are typically designed for efficient operation in only one of these modes. The invention includes a controller (20) that pulses the individual diode blocks (12) on and off, but not necessarily in unison. For a pulsed mode of operation, the diodes (12) in an array are pulsed either at the same time, or sub-arrays are pulsed in a temporally interleaved manner for a higher effective pulse repetition rate. For the cw mode of operation, the diodes (12) are pulsed sequentially in sub-arrays (A-E), such that at least one sub-array is always energized and the complete array appears to be providing continuous pumping energy. In one embodiment, the sub-arrays (A-E) are columns of the array. In another embodiment, the sub-arrays (12') are each associated with a different solid-state gain medium (10'), the gain media being optically coupled in a single laser.

22 Claims, 2 Drawing Sheets

5,748,654

1

DIODE ARRAY PROVIDING EITHER A PULSED OR A CW MODE OF OPERATION OF A DIODE PUMPED SOLID STATE LASER

BACKGROUND OF THE INVENTION

This invention relates generally to diode pumped solid state lasers (DPSSLs) and, more particularly, to the configuration and operation of arrays of pump diode lasers used in solid state lasers of high power. Diode pumped solid state lasers are being developed as laser machine tools. They include a gain medium in which laser light is amplified as a result of optical energy being pumped into the gain medium from an array of diode lasers, known as pump diode lasers. Throughout this specification, when the abbreviated terms "diode" and "diodes" are used, they should be taken to mean "diode laser" and "diode lasers," respectively. Basically, there are two possible configurations in which such a laser may be used. In one, a laser cavity is formed by mirrors located at opposite ends of one or more gain media, and the laser operates as a resonator or oscillator. In the other configuration, a master oscillator provides a high quality, low power laser beam, which is amplified in one or more gain media prior to output. Some laser machining processes require short pulses of laser operation while others require continuous-wave (cw) operation. Therefore, it would be cost effective to provide a single laser design that could function in both pulsed and cw modes without compromising performance or requiring significant replacement of components when changing from one mode of operation to the other. Diode arrays are designed to operate in cw mode or in pulsed mode, but the same array will not operate efficiently in both modes.

The conventional approach to solving this problem is to use cw mode diode pump arrays to drive solid state lasers when cw output is required, and to use pulsed diode pump arrays to drive solid state lasers when pulsed output is required. Pulsed operation of a diode array designed for cw operation is possible, but the initial diode array costs may then be higher by a factor of two or more compared with pulsed diodes, and the diodes will not be operated efficiently when used in the pulsed mode. It is impossible to operate pulsed mode diodes in cw mode for very long without damaging or destroying the diodes.

Accordingly, it would be desirable to be able to provide for either the pulsed mode or the cw solid state laser mode of operation using a single diode array structure, but without compromising performance. The present invention achieves this goal.

SUMMARY OF THE INVENTION

The present invention resides in a diode array capable of operation in pulsed mode or in a quasi-continuous-wave mode in which each diode in the array is pulsed but the overall effect is to provide continuous-wave solid state laser operation. Briefly, and in general terms, the diode array of the invention comprises a plurality, N, of sub-arrays of pump diodes, each sub-array having a plurality of diodes that are electrically connected in such a way as to be energized together; a plurality of at least N switches for separately energizing the sub-arrays; and a programmable controller coupled to the switches and operable either in a pulsed mode in which the sub-arrays are energized and de-energized periodically, or in a continuous mode in which the sub-arrays are energized and de-energized sequentially to maintain at least one sub-array energized at any time. In one embodiment of the invention, each sub-array is a column of blocks of diodes in the array. The blocks of diodes in each column are connected in series; and each sub-array or column is energized for approximately (100/N) % of the operating time, i.e. on a (100/N) % duty cycle. By way of example, the illustrative embodiment has five columns of blocks of diodes and each column is energized approximately 20% of the time. Each successive column is energized slightly before a preceding column is de-energized, to allow time for maximum power output to be reached before the preceding column is de-energized.

In another embodiment of the invention, each sub-array is associated with a separate solid state amplifier, and the programmable controller switches the sub-arrays on and off to supply diode pumping to successive solid state amplifiers in a cyclic manner.

In accordance with another aspect of the invention, sub-arrays of pump laser diodes are energized and de-energized in a temporally interleaved manner to provide pulsed operation at a higher effective pulse repetition rate than could be obtained by pulsing all the sub-arrays in unison.

In terms of a method for controlling a switchable diode array, the present invention comprises the steps of connecting a plurality of pump diodes in a plurality, N, of sub-arrays, each sub-array having diodes connected together in such a way as to be energized at the same time; selecting between a pulsed mode and a continuous mode of operation; if the pulsed mode is selected, pulsing the diodes in each sub-array on and off periodically; and if the continuous mode is selected, pulsing the diodes in each sub-array on and off in a sequential manner, such that only a selected number of sub-arrays are fully energized at any time, whereby, the diode array provides continuous pumping power even though its member diodes are pulsed. In the pulsed mode of operation, the sub-arrays may be pumped either in unison or in a temporally interleaved manner for a higher effective pulse repetition rate. More specifically, the step of pulsing the diodes in each sub-array in the continuous mode includes pulsing only one sub-array at a time, wherein each sub-array is energized on an approximately (100/N) % duty cycle.

In one embodiment of the method, each sub-array is a column of blocks of diodes in the array; and the connecting step includes connecting the diodes in each column in series. Each sub-array or column is energized for approximately (100/N) % of the time. By way of example, there are five columns of blocks of diodes in the array; and each column is energized approximately 20% of the time. The step of pulsing the diodes in the continuous mode includes energizing each successive column before a preceding column is de-energized, to allow for maximum power output to be reached before the preceding column is de-energized.

In an alternate embodiment of the method, each sub-array is associated with a separate solid state amplifier; and the step of pulsing the sub-arrays in a continuous mode provides laser pumping power to successive solid state amplifiers in a cyclic manner. The solid state amplifiers are optically coupled together in a single laser cavity.

The invention may also be defined as a diode pumped solid state laser, operable in a pulsed mode or a continuous mode with pump diodes designed for pulsed operation. The solid state laser of the invention comprises at least one solid state gain medium for amplifying laser light that passes back and forth through the solid state amplifier; optical reflectors defining a laser cavity in the which the solid state amplifier or amplifiers are positioned; and optical means for outcoupling light from the laser cavity. The laser further comprises an array of pump diodes, the array having a plurality, N, of sub-arrays of pump diodes, each sub-array having a plurality of diodes that are electrically connected in such a way as to be energized together; a plurality of at least N switches for separately energizing the sub-arrays; and a programmable controller coupled to the switches and operable in a selected one of two modes, including a pulsed mode in which the sub-arrays are energized and de-energized periodically, and a continuous mode in which the sub-arrays are energized and de-energized sequentially to maintain at least one sub-array energized at any time.

It will be appreciated from the foregoing that the present invention represents a significant advance in the field of diode pumped solid state lasers. In particular, the invention provides a novel technique for operating a pump diode array in either pulsed or cw modes, while the individual diodes in the array are operated in pulsed mode. Other aspects and advantages of the invention will become apparent from the following more detailed description, taken in conjunction with the accompanying drawings.

DESCRIPTION OF THE PREFERRED EMBODIMENT

Figure 1:
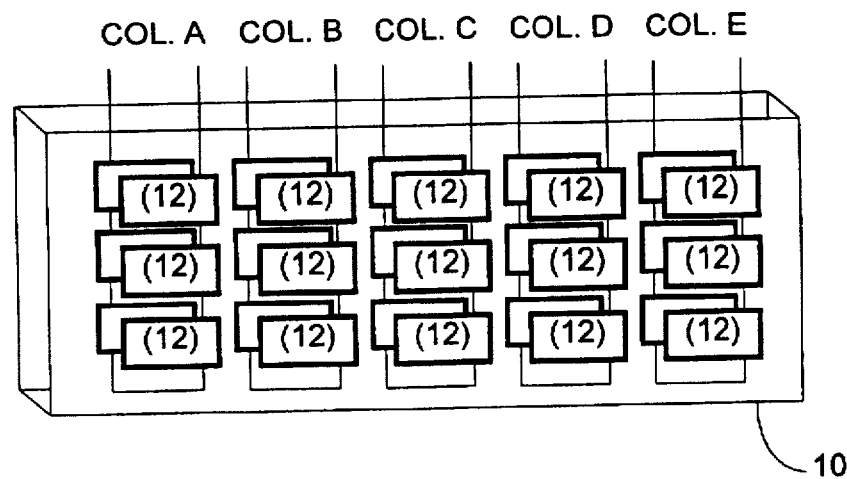
FIG. 1 is a diagrammatic perspective view of two arrays of diodes disposed on opposite faces of a solid state laser gain medium and connected in accordance with the invention.

As shown in the drawings for purposes of illustration, the present invention pertains to diode pumped solid state lasers and specifically to a technique for connecting and operating arrays of pump diodes in such a manner that selected diodes in the array are pulsed, but the entire array, or multiple arrays, are selectively operated to output optical energy either in a pulsed mode or continuously. Diode arrays suitable for pumping high power solid state laser amplifiers are designed and manufactured to be operated either in a continuous-wave (cw) mode of operation or in a pulsed mode of operation. Some applications, such as machine tools, require both modes of operation to be available for specific machining processes. Therefore, it would be desirable to have a single pump diode structure that was capable of supporting either mode of operation without having to substitute components and without compromising performance.

In accordance with the invention, arrays of pump diodes are connected and controlled in such a mainer as to produce continuous-wave (cw) operation of a solid state laser, while each diode within the arrays is individually operated in pulsed mode. Entire arrays of pump diodes may also be operated in pulsed mode without replacing or modifying diode components, thereby providing convenient selection of overall operation in either cw or pulsed modes.

FIG. 1 shows in diagrammatic form a solid state gain medium, indicated by reference numeral 10, into which optical energy is pumped from two opposing arrays of diode blocks 12. Each block 12 typically contains a large number of diode lasers. The gain medium 10 may take the form of a generally flat slab of a selected solid state material, or the medium may be of some other geometrical form, such as a rod or cylinder. The arrays of diode blocks 12 are disposed along opposite faces of the gain medium. In the illustrative embodiment of the invention, the diode blocks 12 in each of the arrays are arranged in a rectangular matrix of rows and columns. More specifically there are five columns, each with three blocks of diodes. For pulsed operation of the amplifier, the diode blocks 12 are connected in such a manner that they can be all switched on and off in unison. For operation in cw mode, the diode blocks 12 are connected in five separate series strings. Each of the five columns, designated A, B, C, D and E in the figure, has its six diode blocks connected in series, three adjacent to one face of the amplifier 10 and three adjacent to the other face.

Figure 3:
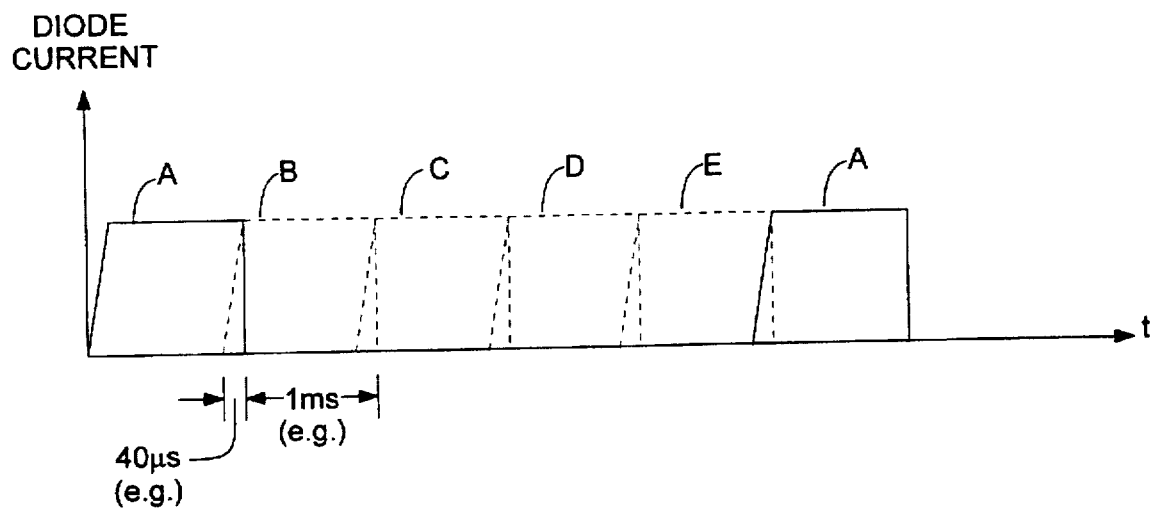
FIG. 3 is a graph showing the diode current in five sub-arrays of diodes operated in accordance with the invention.

Operation in the cw mode requires that each of the columns of diode blocks 12 be operated at approximately a 20% duty cycle, i.e. with the diodes "on" only 20% of the time. As shown in FIG. 3, the column A diodes are switched on every 5 milliseconds (ms), for example, for approximately 1 ms each. Because a certain amount of energy must be absorbed before the gain medium begins to output light at full power, the five diode columns must temporally overlap to ensure that the overall light output from the arrays will be constant. Therefore, as shown in FIG. 3, the column B diodes will be energized prior to the time that the column A diodes are turned off. Then each successive column of diodes is turned on before the preceding one is turned off. The cycle of operations continues as shown, producing an overall effect of continuous operation of the pump diodes 12, even though the individual diodes are still operated in pulsed mode.

Figure 2:
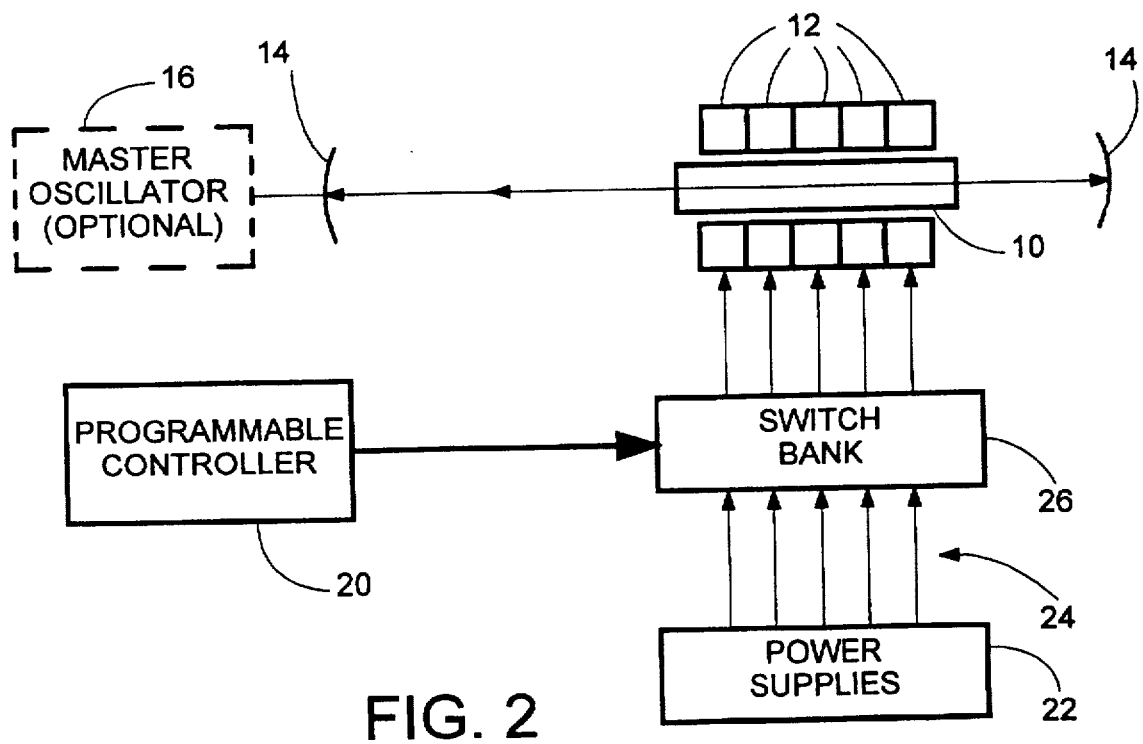
FIG. 2 is a block diagram of a solid state laser in accordance with the present invention.

FIG. 2 shows how the amplifier 10 and diode blocks 12 are employed in conjunction with other components of a diode pumped solid state laser. In its most fundamental form, the laser may include, in addition to the gain medium 10 and diode blocks 12, a laser cavity defined by a pair of opposed mirrors 14, one of which is only partially reflective to provide outcoupling of light from the laser cavity. The invention may be used either in a configuration in which the gain medium 10 functions as a resonator or oscillator, or in a configuration that includes a master oscillator 16 to provide a low power, high quality beam for input to the gain medium 10, which, in the latter configuration, operates as an amplifier. Although light passing through the gain medium 10 is depicted as a single straight line, it will be understood that, in some configurations, light traverses the medium by multiple internal reflections from its side faces. It should also be understood that the specific configuration of the laser is not pertinent to the present invention, which will operate in any solid state laser configuration to provide either pulsed or cw operation. For example, the gain medium 10 may employ rod geometry rather than take the form of a slab.

Switching of the diodes in the diode blocks 12 is controlled by a relatively simple programmable controller 20, which may be a conventional microprocessor. As illustrated by way of example, diode power supplies 22 are connected to the diodes by lines 24, through a bank of switches 26. The principal function of the controller 20 is to provide switching signals to the switches 26, and thereby to activate the columns of diode blocks 12 selectively. In the cw mode, the switches are operated in accordance with the approximately 20% duty cycle, as discussed above with reference to FIG. 3. When pulsed operation is desired, the diode blocks 12 are still switched on a 20% (or lower) duty cycle, but all the columns A, B, C, D and E are switched on and off at the same time.

The controller 20 may also be conveniently programmed to operate the diode blocks 12 in a pulsed mode but at a higher repetition rate than is obtained by switching all the columns of blocks 12 in unison. For example, suppose that the highest repetition rate that could be obtained by switching the columns A, B, C, D and E in unison was 2 kHz (kilohertz). At a constant duty cycle (e.g. 20%), the diode laser pump pulse length shortens as the repetition rate increases. Laser gain medium (e.g. Nd:YAG) efficiency degrades with short pump pulses, so the repetition rate for efficient operation is limited to approximately 2 kHz (100 μs pump pulse width). By temporally interleaving the five columns of diodes, the effective repetition rate can be increased to 10 kHz while maintaining a pulse width comparable with that associated with 2 kHz operation. In accordance with this aspect of the invention, selected groups of diode lasers, such as the columns A, B, C, D and E, are operated such that their output pulses are temporally interleaved to provide a higher effective repetition rate in the pulsed mode. Interleaving of pulses from the separate columns of diode blocks 12 is similar to the interleaving depicted in FIG. 3, but the width of the "on" pulses for each column is smaller, resulting in a higher effective pulse repetition rate. For example, a rate of 10 kHz can be obtained if the non-interleaved rate was 2 kHz, with the pulse width reduced by a tolerable amount, such as to 80 μs, i.e. a duty cycle of 16%. Alternatively, if one wished to maintain a pulse width of 100 μs and a 20% duty cycle at 2 kHz, four columns of diode blocks could be temporally interleaved to provide an effective pulse repetition rate of 8 kHz.

Figure 4:
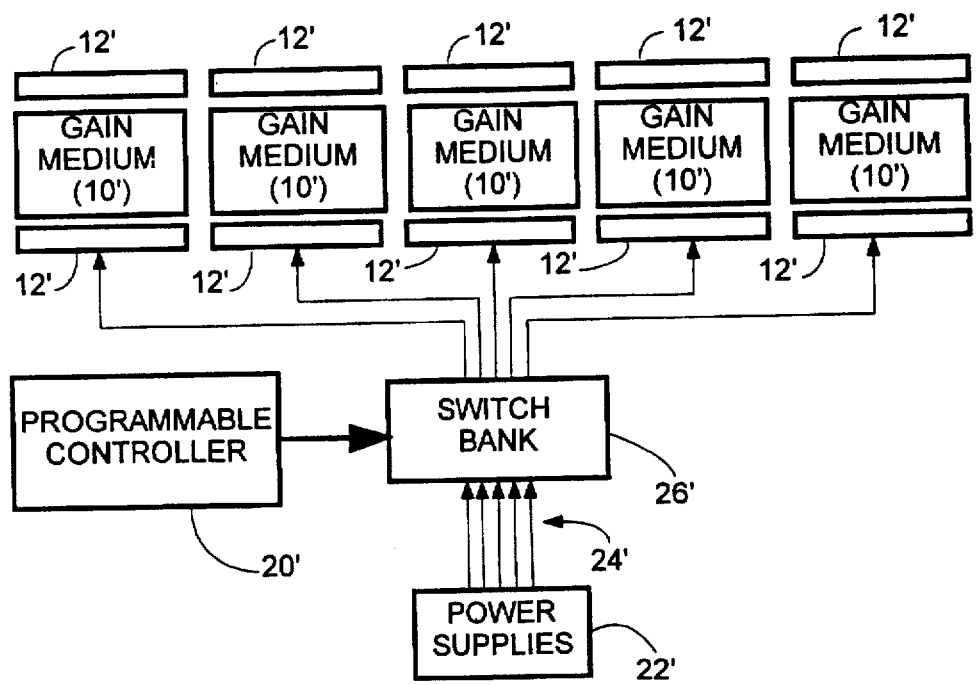
FIG. 4 is a block diagram of another embodiment of the present invention, in which multiple arrays of diodes are disposed on opposite faces of multiple solid state gain media of the same solid state laser.

In an alternate embodiment of the invention, a diode pumped solid state laser employs multiple solid state gain media 10' arranged optically in series, as shown in FIG. 4. As illustrated, there are five gain media 10', providing a 20% duty cycle, but the invention may use four or some other number of gain media 10'. Each of the media 10' has an opposed pair of diode arrays, indicated at 12'. In this embodiment, each of the five pairs of diode arrays 12' is activated on a 20% duty cycle, but the individual diodes within the arrays pairs are pulsed in unison within the array pair. Thus, the first amplifier is activated for one millisecond, for example, the second amplifier for the next millisecond, and so forth, providing a cw mode of operation for the entire laser, but pulsed operation for each of the five amplifiers and their associated diode array pairs. For true pulsed operation in this embodiment, all the diodes in all of the amplifiers are pulsed in unison, or may be temporally interleaved to provide a higher pulse repetition rate, as discussed above. Control of the diodes is again effected by means of a programmable controller 20', and switches 26' directing flow of power from the power supplies 22', over wires 24'.

It will be appreciated from the foregoing that the present invention represents a significant advance in the field of diode pumped solid state lasers. Specifically, the invention provides a novel technique for switching pump diode arrays in such a manner that the solid state laser can be operated in either pulsed mode or in cw mode. The cw mode of operation of the laser is achieved without continuous operation of the individual diodes. It will also be appreciated that, although the specific embodiments of the invention have been described in detail for purposes of illustration, various modifications may be made without departing from the spirit and scope of the invention. Accordingly, the invention should not be limited except by the accompanying claims.

We claim:

1. For use in a diode pumped solid state laser, a switchable diode array, comprising:

a plurality, N, of sub-arrays of pump diodes, each sub-array having a plurality of diodes that are electrically connected in such a way as to be energized together;

a plurality of at least N switches for separately energizing the sub-arrays; and a programmable controller coupled to the switches and operable in a pulsed mode in which the sub-arrays are energized and de-energized periodically, and in a continuous mode in which the sub-arrays are energized and de-energized sequentially to maintain at least one sub-array energized at any time.

2. A switchable diode array as defined in claim 1, wherein:

each sub-array is a column of blocks of diodes in the array;

the blocks of diodes in each column are connected in series; and each sub-array or column is energized for approximately (100/N) % of the time.

3. A switchable diode array as defined in claim 2, wherein:

there are five columns of blocks of diodes; and each column is energized approximately 20% of the time.

4. A switchable diode array as defined in claim 2, wherein:

in the continuous mode, each successive column is energized before a preceding column is de-energized, to allow time for maximum power output to be reached before the preceding column is de-energized.

5. A switchable diode array as defined in claim 1, wherein:

each sub-array is associated with a separate solid state amplifier; and the programmable controller switches the sub-arrays on and off to supply diode pumping to successive solid state gain media in a cyclic manner.

6. A switchable diode array as defined in claim 1, wherein:

in the pulsed mode, the programmable controller operates the switches to provide temporal interleaving of the sub-arrays and a higher pulse repetition rate.

7. A switchable diode array as defined in claim 1, wherein:

in the pulsed mode, the programmable controller operates the switches to energize all of the sub-arrays in unison.

8. A method for controlling a switchable diode array to provide operation in either of two modes, the method comprising the steps of:

connecting a plurality of pump diodes in a plurality, N, sub-arrays, each sub-array having diodes connected together in such a way as to be energized together;

selecting between a pulsed mode and a continuous mode of operation;

when the pulsed mode is selected, pulsing the diodes in each sub-array on and off periodically; and when the continuous mode is selected, pulsing the diodes in each sub-array on and off in a sequential manner, such that only a selected number of sub-arrays are fully energized at any time, whereby, the diode array provides continuous pumping power even though its member diodes pulsed.

9. A method as defined in claim 8, wherein:

the step of pulsing the diodes in each sub-array in the continuous mode includes pulsing only one sub-array at a time, wherein each sub-array is energized on an approximately (100/N) % duty cycle.

10. A method as defined in claim 8, wherein:

each sub-array is a column of blocks of diodes in the array;

the connecting step includes connecting the diodes in each column in series; and each sub-array or column is energized for approximately (100/N) % of the time.

11. A method as defined in claim 10, wherein:

there are five columns of blocks of diodes in the array; and each column is energized approximately 20% of the time.

12. A method as defined in claim 10, wherein:

the step of pulsing the diodes in the continuous mode includes energizing each successive column a short time before a preceding column is de-energized, to allow for maximum power output to be reached before the preceding column is de-energized.

13. A method as defined in claim 8, wherein:

each sub-array is associated with a separate solid state amplifier; and the step of pulsing the sub-arrays in a continuous mode provides laser pumping power to successive solid state gain media in a cyclic manner.

14. A method as defined in claim 8 wherein:

if the pulsed mode is selected, the step of pulsing the diodes in each sub-array on and off periodically energizes and de-energizes the sub-arrays at the same time.

15. A method as defined in claim 8, wherein:

if the pulsed mode is selected, the step of pulsing the diodes in each sub-array includes temporally interleaving periods during which the sub-arrays are energized, to provide a higher effective repetition rate.

16. A diode pumped solid state laser, operable in a pulsed mode or a continuous mode with pump diodes designed for pulsed operation, the solid state laser comprising:

at least one solid state gain medium for amplifying laser light that passes back and forth through the solid state gain medium;

optical reflectors defining a laser cavity in which the at least one solid state gain medium is positioned;

optical means for outcoupling light from the laser cavity;

an array of pump diodes, the array having a plurality, N, of sub-arrays of pump diodes, each sub-array having a plurality of diodes that are electrically connected in such a way as to be energized together;

a plurality of at least N switches for separately energizing the sub-arrays; and a programmable controller coupled to the switches and operable in a selected one of two modes, including a pulsed mode in which the sub-arrays are energized and de-energized periodically, and a continuous mode in which the sub-arrays are energized and de-energized sequentially to maintain at least one sub-array energized at any time.

17. A diode pumped solid state laser as defined in claim 16, wherein:

each sub-array is a column of blocks of diodes in the array;

the blocks of diodes in each column are connected in series; and each sub-array or column is energized for approximately (100/N) % of the time.

18. A diode pumped solid state laser as defined in claim 17, wherein:

there are five columns of blocks of diodes; and each column is energized approximately 20% of the time.

19. A diode pumped solid state laser as defined in claim 17, wherein:

in the continuous mode, each successive column is energized a short time before a preceding column is de-energized, to allow time for maximum power output to be reached before the preceding column is de-energized.

20. A diode pumped solid state laser as defined in claim 16, wherein:

the laser includes a plurality of solid state gain media;

each sub-array is associated with a separate solid state gain medium; and in the continuous mode, the programmable controller switches the sub-arrays on and off to supply diode pumping to successive solid state gain media in a cyclic manner.

21. A diode pumped solid state laser as defined in claim 16, wherein:

in the pulsed mode, the programmable controller operates the switches to energize and de-energize the sub-arrays in unison.

22. A diode pumped solid state laser as defined in claim 16, wherein:

in the pulsed mode, the programmable controller operates the switches to energize an de-energized the sub-arrays in a temporally interleaved manner, to provide a higher effective pulse repetition rate.

* * * * *